United States Patent [19]
Maa et al.

[11] Patent Number: 5,830,775
[45] Date of Patent: Nov. 3, 1998

[54] RAISED SILICIDED SOURCE/DRAIN ELECTRODE FORMATION WITH REDUCED SUBSTRATE SILICON CONSUMPTION

[75] Inventors: Jer-shen Maa, Vancouver; Shen Teng Hsu, Camas, both of Wash.

[73] Assignees: Sharp Microelectronics Technology, Inc., Camas, Wash.; Sharp Kabushiki Kaisha, Osaka, Japan

[21] Appl. No.: 756,782

[22] Filed: Nov. 26, 1996

[51] Int. Cl.$^6$ .................. H01L 21/283; H01L 21/335
[52] U.S. Cl. ................... 437/41 SM; 437/193; 437/200; 148/DIG. 19
[58] Field of Search ............... 437/41 SM, 200, 437/193, 201; 148/DIG. 19

[56] References Cited

U.S. PATENT DOCUMENTS

| | | | |
|---|---|---|---|
| 4,873,204 | 10/1989 | Wong et al. | 437/200 |
| 5,242,847 | 9/1993 | Ozturk et al. | 437/41 |
| 5,346,860 | 9/1994 | Wei | 437/200 |
| 5,387,535 | 2/1995 | Wilmsmeyer | 437/57 |
| 5,576,244 | 11/1996 | Hayashi et al. | 437/200 |
| 5,624,871 | 4/1997 | Teo et al. | 438/453 |

FOREIGN PATENT DOCUMENTS

| | | | |
|---|---|---|---|
| 1-166540 | 6/1989 | Japan | 437/200 |

OTHER PUBLICATIONS

Yamada, K., et al., "Ultra–Low Contact Resistance . . . " 1994 Symp. VLSI Tech. Dig. of Tech. Papers, Jun. 1994, pp. 63–64.

*Primary Examiner*—T. N. Quach
*Attorney, Agent, or Firm*—David C. Ripma; Gerald W. Maliszewski

[57] ABSTRACT

A method is provided for forming silicided source/drain electrodes in active devices wherein the electrodes have very thin junction regions. In the process silicidation material is deposited on the wafer and rapid-thermal-annealed at a temperature and for a time calculated to produce metal-rich or silicon-deficient silicide on the electrodes. The metal-rich or silicon-deficient silicide is selectively formed on the semiconductor electrodes and not on oxide or other insulating surfaces. A selective etch removes the silicidation material which has not reacted with silicon, including metal overlying insulating surfaces. Then, after cleaning the silicide surfaces, a layer of silicon is deposited over the structure and a second rapid thermal anneal is performed at a higher temperature than the first rapid thermal anneal. In the second rapid thermal anneal additional silicon from the deposited silicon layer is incorporated into the silicide converting it from metal-rich or silicon-deficient silicide into the more stable disilicide phase silicide. Upon removal of any unconsumed silicide, the disilicide contacts are completed. The process can be controlled to produce ultra-thin junction depths of less than 500 Å with overlying silicide contacts of up to 1000 Å or more in thickness. The result is the formation of thermally stable silicide contacts which are self-aligned with the electrodes.

20 Claims, 5 Drawing Sheets

RAISED SILICIDED SOURCE/DRAIN ELECTRODE FORMATION WITH REDUCED SUBSTRATE SILICON CONSUMPTION

BACKGROUND AND SUMMARY OF THE INVENTION

The invention relates generally to semiconductor technology and more particularly to the formation silicided electrodes in active semiconductor devices, such as MOS transistors.

An important subject of ongoing research in the semiconductor industry is the reduction in the dimensions of devices used in integrated circuits. Planar transistors such as metal oxide semiconductor (MOS) transistors are particularly suited to use in high density integrated circuits. As the size of MOS transistors and other active devices decreases the dimensions of the source, drain, and gate electrodes and the channel region of each device decreases correspondingly.

The design of ever smaller planar transistors with short channel lengths makes it necessary to provide very shallow source/drain junction regions. Shallow junctions are necessary to avoid lateral diffusion of implantation dopants into the channel, such diffusion being undesirable because it contributes to leakage currents and poor breakdown performance. Shallow source/drain junction regions, for example less than 1000 Å thick, and preferably less than 500 Å thick, are necessary for acceptable performance in short-channel devices.

When shallow-junction electrodes are used in transistors it becomes more difficult to provide reliable, low-resistance connections to the source/drain regions of the device. Metal-silicide contacts are a typical means of effecting such connections to source/drain/gate electrodes. In such contacts conductive metal is deposited on the silicon electrodes and annealed to form a metal-silicon compound on the surface of the electrodes. The compound, called silicide, is electrically and physically bonded to the electrode and has a substantially lower sheet resistance than the doped silicon on which it is formed. An important advantage of silicide contacts in small devices is that silicide is only formed where the deposited metal is in contact with silicon. By means of a selective etch the metal is readily removed from the non-silicided areas. Thus, the silicide regions are automatically aligned on the electrode surfaces only. This self-aligned silicide process is generally referred to as the "salicide" process.

The difficulty presented by the salicide process on shallow-junction source and drain regions is that it consumes a portion of the surface silicon. The metal silicide is formed from a chemical reaction which occurs during an annealing step, when the deposited metal reacts with the underlying silicon. Electrodes with very thin junction depths have less silicon to sacrifice to the formation silicide and can only permit a very thin layer of silicide to be formed. But thin silicide films are known to be thermally unstable and have an undesirably high sheet resistance.

One prior art technique for increasing the thickness of the silicide contacts is to deposit additional silicon on the surface of the doped source and drain regions. The additional silicon in the raised source and drain electrodes can then be used in the reaction with deposited metal to form thicker silicide layers. This solution has disadvantages because the deposition of additional silicon produces additional diffusion of dopants and other effects which can degrade device performance.

It would be advantageous if an improved salicide process where available to provide low-sheet resistance silicide layers on shallow junction electrodes in a MOS device.

It would also be advantageous if a silicide layer could be formed on a shallow-junction silicon electrode while minimizing the consumption of surface silicon by providing the majority of the required silicon from a source other than the electrode itself.

Accordingly, a method is provided for forming a raised silicided source/drain electrode structure for use in a MOS transistor. The electrode structure is formed on a semiconductor substrate having a surface layer of single-crystal silicon. The steps in the method comprise depositing silicidation material on the single-crystal silicon. The resultant metal-silicon body is then subjected to a first rapid-thermal-anneal at a temperature of less than 700° C. to react the deposited silicidation material with the surface layer of silicon in the substrate to form a layer of silicon-deficient silicide, which is a phase of silicide having proportionally less silicon and more silicidation material than disilicide phase silicide. The silicon-deficient silicide layer formed in the preceding step is then cleaned to remove material other than silicon-deficient silicide. This includes removing unreacted silicidation material and oxide. A layer of silicon is then deposited on the silicon-deficient layer. The deposited silicon will be either amorphous or polycrystalline silicon, either being suitable for use with the present invention. For simplicity the silicon deposited in this step will be referred to herein as deposited silicon. Following the deposition of a layer of silicon, a second rapid-thermal-anneal is performed at a higher temperature than the first rapid-thermal-anneal. The second rapid-thermal-anneal reacts the silicon-deficient silicide layer predominately with silicon from the deposited silicon layer deposited in the preceding step. The result is the transformation of the silicon-deficient silicide into predominantly metal disilicide, which is the most stable form of silicide. Finally, any unreacted silicon is removed from the metal-disilicide to provide a raised silicided electrode.

The method is suitable for forming silicided electrodes on an active area of a semiconductor substrate where devices such as MOS transistors are formed. Each such active area includes a layer of single-crystal silicon adjacent the surface of the substrate, a gate structure on the single-crystal silicon, and electrode areas on the single-crystal silicon on opposite sides of the gate structure. The gate structure includes a gate electrode, gate insulation, and insulting sidewalls. The above-described method is performed after the implantation of doping impurities into the active area to form junction regions, otherwise referred to as electrode regions, in the electrodes. In a typical MOS transistor the electrode regions in the surface silicon of the semiconductor substrate are the source and drain electrodes on opposite sides of the gate structure. The source and drain electrodes preferably have thin junction regions and the features and advantages of the present invention are directed to the formation of silicided contacts on such source and drain electrodes. The gate electrode is usually a thicker deposited region of polycrystalline silicon for which consumption of silicon during salicidation is less critical.

The silicidation material deposited on the silicon electrode regions preferably is one or more metals selected from the group consisting of refractory metals and noble metals. Suitable examples of the silicidation material used with the present invention include Co, Ti, Ni, W Pt, Pd, Mo, and Ta. The deposited silicidation material is preferably deposited to a thickness of 50 Å to 250 Å over the entire active area of the substrate. The first rapid-thermal-anneal, at a temperature of less than 700° C., and preferably at a temperature between 400° C. and 650° C., is performed for between 10 seconds and 60 seconds. The time and temperature of the first anneal is controlled to produce silicon-deficient silicide, not disilicide phase silicide. In that way the amount of silicon consumed is minimized in the electrode regions. The resultant silicon-deficient silicide can then be selectively etched to remove unreacted metal from both the silicon-deficient silicide and non-silicon surfaces such as the field oxide and gate sidewalls. Stable disilicide is then formed by depositing a layer of silicon over the active region and performing the second, higher-temperature anneal. The silicided electrodes remain overlying the source, drain, and gate electrodes after a final surface cleaning is performed to remove unreacted silicon. In accordance with the present invention, the majority of the silicon in the silicide contacts on the source/drain electrodes comes from the deposited silicon and not from the substrate silicon.

DETAILED DESCRIPTION OF THE PREFERRED EMBODIMENT

Figure 1:
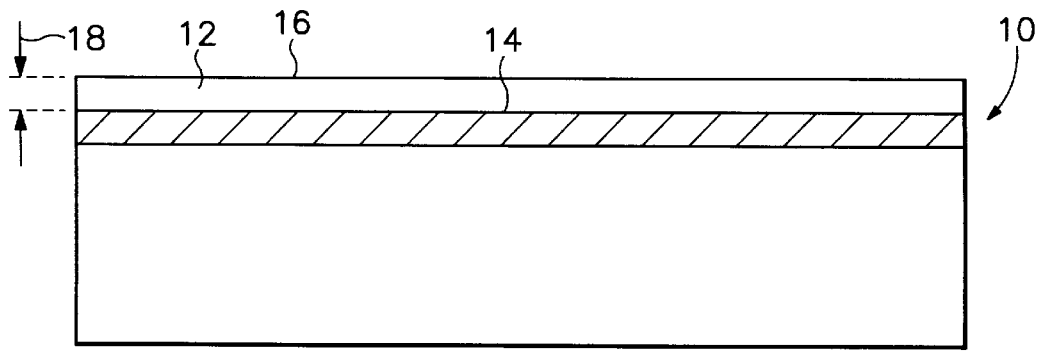
FIGS. 1 and 2 are schematic cross-sectional views showing preliminary steps in the formation of a MOS transistor on a SIMOX wafer (prior art).

Returning to FIG. 1 (prior art), the starting substrate material used in the illustrated embodiment is a SIMOX wafer 10 having a very thin surface layer 12 of single-crystal silicon overlying a buried oxide layer 14. SIMOX is an acronym for "Separation by IMplanted OXygen" and provides a suitably thin layer of single-crystal silicon adjacent the top surface 16 of substrate 10. For use in the present invention, surface silicon layer 12 has an overall thickness 18 of less than 2000 Å and preferably less than 1000 Å.

Figure 2:
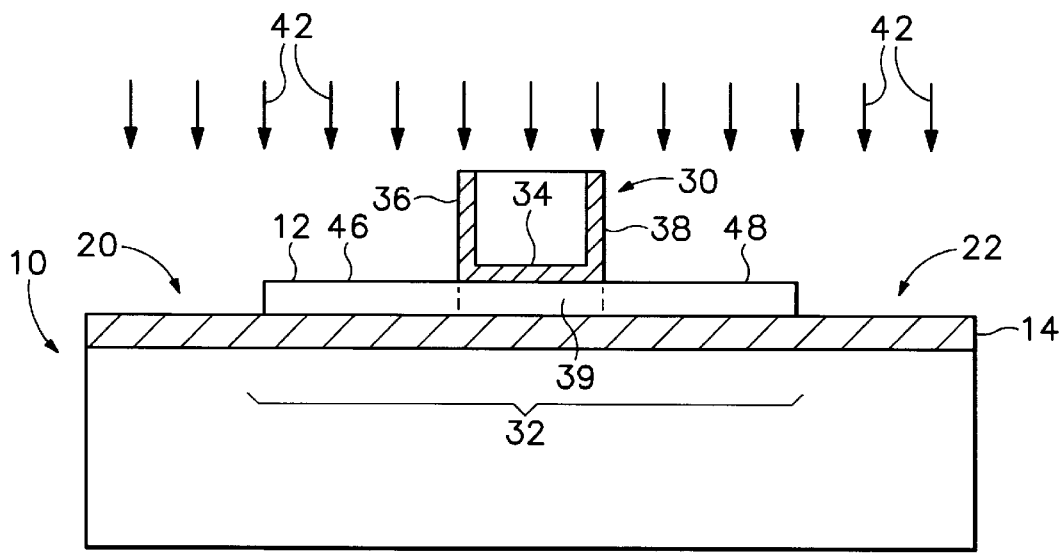

FIG. 2 shows the result of several well known preliminary steps in the formation of a planar transistor on substrate 10, for example, a metal oxide semiconductor (MOS) transistor. The processing of substrate 10 includes isolating an active area 32 where the device is formed by removing portions of silicon layer 12 down to the oxide 14 in side areas 20, 22. Other steps include implantation of appropriate doping impurities into silicon layer 12 to create n-type or p-type semiconductor material. A gate structure 30 is formed centrally on active area 32. Gate structure 30 is formed by suitable photolithographic and etching steps to create a gate oxide layer 34, sidewalls 36, 38 and a gate electrode 40, which is typically formed of polycrystalline silicon. Gate structure 30 overlies the channel region 39 of the device.

Ion implantation, illustrated schematically by arrows 42 in FIG. 2, and subsequent diffusion of the dopants in the superficial silicon 12, forms source and drain junction regions 46, 48, respectively, in silicon layer 12. The source/drain junction regions 46, 48 extend through silicon layer 12 in the active area 32 of the substrate, on opposite sides of gate structure 30. For the purposes of the present invention, the designation of regions 46 and 48 as source and drain, respectively, is arbitrary and may be reversed. In other words region 48 may be designated the source electrode region and 46 the drain electrode region, or visa versa. In the discussion which follows, regions 46, 48 are collectively referred to as the source and drain junction regions or, alternatively, as electrode areas 46, 48 or, singly, as a source/drain electrode.

Figure 3:
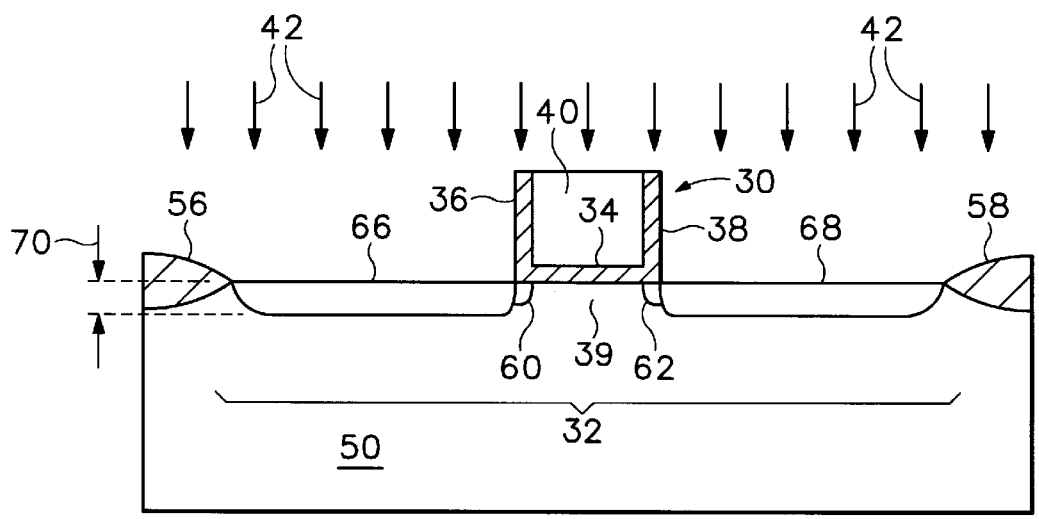
FIG. 3 is a schematic cross-sectional view as in FIGS. 1 and 2 illustrating the formation of a MOS transistor similar to that in FIG. 2, but in bulk silicon instead of SIMOX (prior art).

The method of the present invention can alternatively be performed on devices fabricated in bulk silicon instead of a SIMOX wafer. FIG. 3 (prior art) is a schematic illustration of the preliminary preparation of a bulk silicon wafer 50 for use with the present invention. Preparation of a bulk silicon wafer results in elements which duplicate elements of the SIMOX structure of FIG. 2. In the description which follows, selected elements used in both wafer types (shown in FIGS. 2 and 3) will be referred to with common reference numbers. On the surface 52 of the bulk silicon wafer is an appropriately doped p-well or n-well region 54 in the silicon. An active area 32 is isolated and defined by field oxide regions 56, 58 which are conventionally formed using well-known processing steps. A gate structure 30, like the gate structure shown in FIG. 2, is provided centrally on active area 32. Typically, a light implantation of doping materials is directed at the substrate before the gate sidewalls 36, 38 are formed to create lightly doped, or LDD, junction regions 60, 62 adjacent the device channel region 39. Then, after formation of sidewalls 36, 38 a heavier dose of appropriate doping impurities are implanted into the source/drain electrode regions 66, 68. Lightly doped regions similar to regions 60, 62 are also formed selectively in SIMOX wafer devices, but those regions have been omitted from FIG. 2 and the other figures below for simplicity.

In the bulk silicon device of FIG. 3, the implantation of appropriate doping impurities, illustrated schematically by arrows 42, results in the formation of source/drain electrode regions 66, 68 in the silicon substrate 54. Implantation and diffusion of the doping impurities produces junction regions having a depth 70 below substrate surface 52. Junction depth 70 is preferably about the same as the thickness of superficial silicon layer 12 in the SIMOX device of FIG. 2. That is, the junction depth 70 should be less than 2000 Å and preferably less than 1000 Å for fabrication of the small-dimension devices suitable for use in Ultra Large Scale Integration (ULSI) integrated circuits. Further details of the steps required for the structures shown in FIGS. 2 and 3 are well known to those skilled in the art and will not be further described herein. The steps in the method of the present invention set forth below will be described with reference to a SIMOX structure of FIG. 2.

Figure 4:
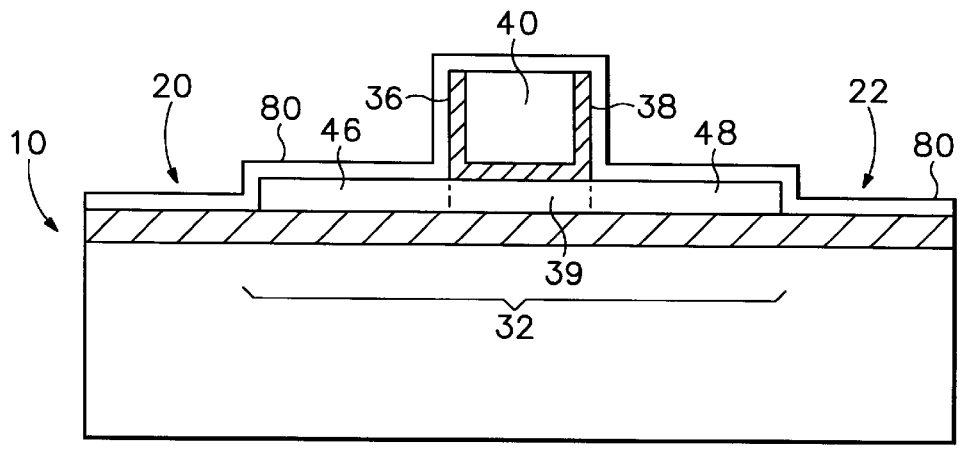
FIGS. 4–8 are views, as in FIGS. 1 and 2, showing subsequent processing steps of the SIMOX wafer of FIG. 2 for forming raised silicided electrodes with reduced substrate silicon consumption in accordance with the present invention.

Referring to FIG. 4, following the formation of gate structure 30 and the ion implantation steps creating source and drain electrode regions 46, 48, a layer of silicidation material 80 is deposited on substrate 10. Silicidation material thus covers the single-crystal silicon of source/drain electrodes 46, 48. Suitable materials for use in siliciding semiconductor electrodes include refractory metals and noble metals. Examples of the silicidation material includes Co, Ti, Ni, W, Pt, Pd, Mo, and Ta. Layer 80 preferably has a thickness generally in the range of 50 Å to 300 Å. Layer 80 is either a uniform layer of a single metal, for example cobalt, or, alternatively, is made up of more than one layer of silicidation material. For example, layer 80 might include a lower layer of Ti, and an upper layer of Co. Other layered or alloyed combinations of suitable silicidation materials for use in creating silicide contacts on semiconductor electrodes will occur to those skilled in the art.

Figure 5:
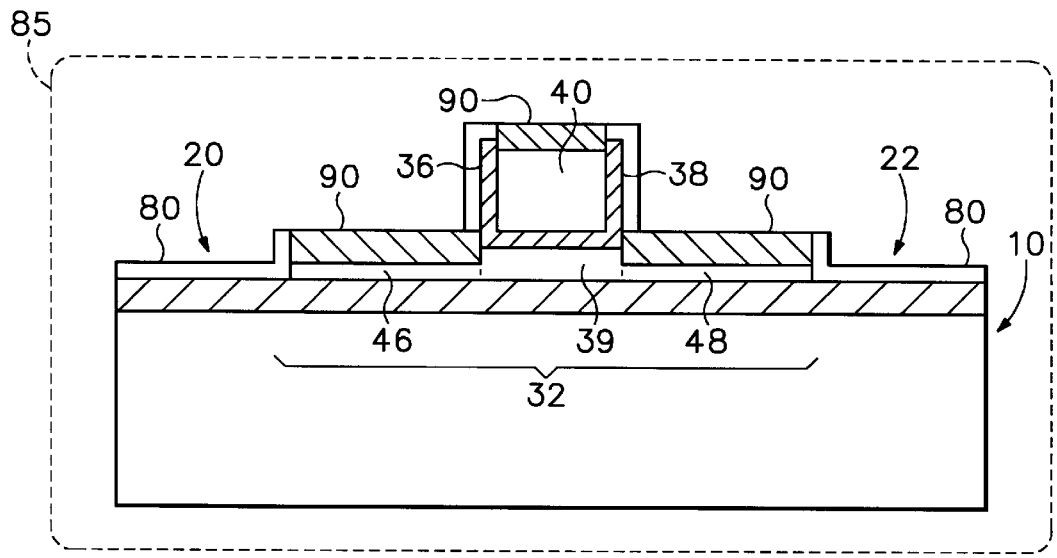

The next step, illustrated in FIG. 5, is rapid-thermal-annealing. The substrate is annealed in a suitable annealing chamber indicated schematically at 85. The anneal is carried out at a temperature, and for a duration, which reacts the silicidation material in layer 80 with areas of surface silicon to yield a silicon-deficient silicidation material/silicon product at the boundaries between metal layer 80 and silicon regions 40, 46, 48, indicated by shaded areas 90 in FIG. 5. The silicon-deficient silicide product, as the term is used herein, is a phase of silicide having proportionally less silicon and more silicidation material than the more stable disilicide phase silicide.

Disilicide phase silicide is $XSi_2$ where X is the selected silicidation material (for example, Co, Ti, Ni, or W). Silicon-deficient silicide is one or more phases of metal silicide in which one, two or more metal atoms are combined with a single silicon atom. As an example, the for formation of $CoSi_2$, the transformation of Co and Si proceeds as follows:

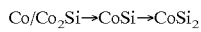

$Co/Co_2Si \rightarrow CoSi \rightarrow CoSi_2$ $Co/Co_2Si$ is the beginning of the transformation of Co metal to a metal-rich phase of silicide. Metal-rich silicide is the name for compounds with more metal atoms than silicon atoms, such as $Co_2Si$. The term "metal-rich" is avoided herein because the compound formed at 90 in FIG. 5 may contain both $Co_2Si$ and CoSi. The latter compound (CoSi) is not truly "metal-rich" because the proportion of metal atoms does not exceed the proportion of silicon atoms. For that reason, the terminology "silicon deficient silicide" is used below to describe both the phase of silicide wherein the metal atoms exceed in number the silicon atoms, and also the phase where the metal and silicon atom are equal in number.

The rapid-thermal-annealing step described with reference to FIG. 5 is specifically tailored to the formation of silicon-deficient silicide. It has been found that, for cobalt-silicide, rapid-thermal-annealing (RTA) at a temperature generally in the range of 450° C. to 500° C. produces $Co_2Si$ in the junction region between an overlying layer of Co and a superficial silicon layer 12. At a slightly higher temperature, for example 550° C. to 600° C., CoSi begins to appear. In the present invention the RTA step described with reference to FIG. 5 (alternatively referred to herein as the first rapid thermal anneal or 1st RTA) the formation of $Co_2Si$ is preferred over CoSi. That is because the proportionate consumption of silicon is less when forming a given thickness of $Co_2Si$ than CoSi. Consequently, in the 1st RTA of FIG. 5 an annealing temperature of less than 700° C. should be used and preferably the temperature should be between 450° C. and 650° C., with the likelihood of forming $Co_2Si$ being improved if the temperature range is between 450° C. and 500° C. The duration of the 1st RTA is between 10 seconds and 5 minutes and preferably between 10 seconds and 60 seconds. It will be readily understood that if a temperature near the lower end of the specified range for the 1st RTA is used, for example, 400° C., –450° C., the duration should be longer than if a higher temperature in the range is used, for example, 600° C.–700° C. As noted above, the purpose the 1st RTA of FIG. 5 is to form either metal-rich silicide such as $Co_2Si$, or CoSi.

Because silicon-deficient silicide 90 contains less silicon and more silicidation material than disilicide silicide, its formation during the anneal of FIG. 5 consumes less of the silicon in the source/drain electrode regions 46, 48. Consequently, it is possible to control and reduce the amount of silicon consumed from the junction regions 46, 48 during silicidation. That permits thinner silicon electrodes to be initially formed in regions 46, 48 than would be possible using conventional silicidation techniques. Thinner electrodes are possible because, in the steps which follow, the additional silicon necessary to convert the early phase silicide regions 90 into more stable disilicide phase silicide consumes little or no additional silicon from the junction regions 46, 48. Instead, the additional silicon is supplied by an overlying sacrificial deposit of silicon. By controlling the duration and temperature of the anneal step shown and described with reference to FIG. 5 the silicide created on electrode regions 46, 48 will be predominately silicon-deficient silicide. Suitable temperatures for encouraging the formation of silicon-deficient silicide are temperatures lower than 700° C. The duration of the anneal is preferably 10 seconds to 60 seconds. The result of such an anneal is that silicon-deficient silicide is formed on the source/drain/gate electrodes. Forming the silicon-deficient phase of silicide consumes substantially less silicon from the electrode regions 46, 48 than would the formation of disilicide phase silicide. Moreover, a greater thickness of silicide is formed from the silicon which is consumed in the formation of silicon-deficient silicide than would occur if disilicide phase silicide were initially formed.

Figure 6:
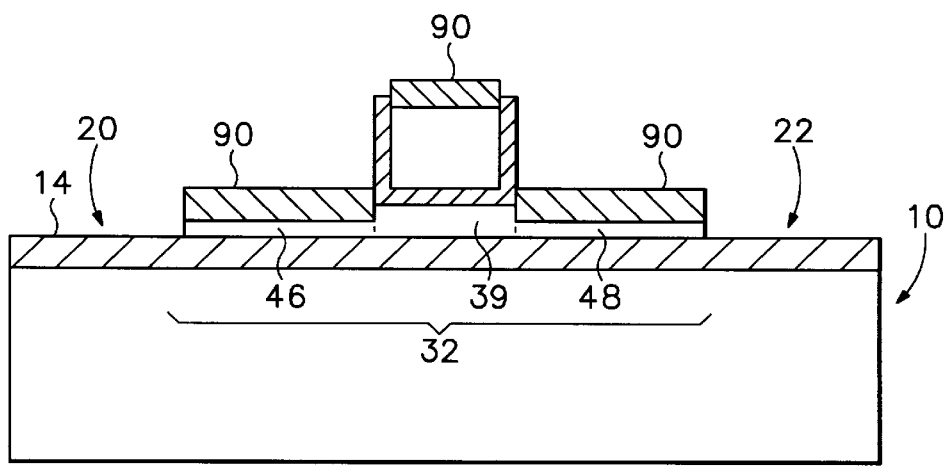

Following the 1st RTA step of FIG. 5, the next step is to etch the resultant structure to remove unreacted silicidation material from the substrate. The result of this removal, referred to herein as the 1st etching step or the removal of unreacted silicidation material step, is shown in FIG. 6. Removal of the unreacted or untransformed silicidation material is accomplished by selectively etching the wafer using a wet etch or similar process which etches silicidation material but not silicon compounds of the silicidation material. A suitable etchant for this purpose is $H_2SO_4/H_2O_2$, which is known in the industry as a piranha etch. An alternative term used herein for the etchant used in this 1st etching step is "silicidation material etchant," which refers to any suitable etching compound for removing unreacted or untransformed silicidation material from surfaces. In FIG. 6, which shows the result of the 1st etch step, all metal which was applied to non-silicon surfaces, such as to the isolation regions 20, 22, and the gate sidewalls 36, 38, have been stripped of silicidation material. Also, any unreacted or untransformed silicidation material is removed from the surfaces of the silicon-deficient silicide areas 90.

The next step is to deposit a layer of silicon on the surface areas of the substrate, but before that is done it is advisable to pre-clean the surfaces of the silicon-deficient silicide areas 90 to remove any surface oxide which has grown or otherwise developed on the silicide during the 1st RTA and piranha etch steps. Removal of oxide is necessary because surface oxide at the boundary between the silicon deficient silicide and the overlying silicon greatly impairs the reaction between them, preventing or inhibiting the conversion of the silicide into disilicide phase silicide. An in-situ argon ion beam clean is recommended for removing surface oxide from silicon deficient silicide regions 90. Other types of ion beam cleaning or similar processes may, alternatively, be used to accomplish the removal of surface oxide.

Figure 7:
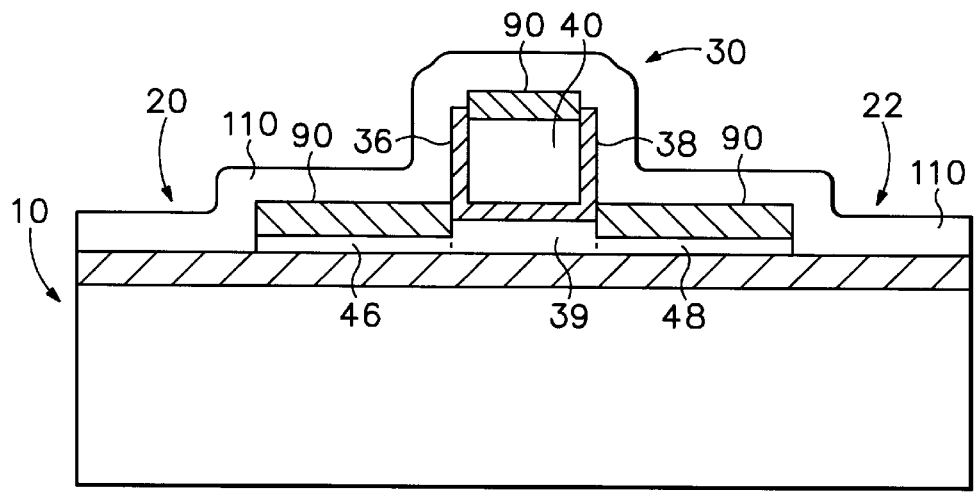

The next step, shown in FIG. 7 is depositing a layer 110 of either amorphous or polycrystalline silicon on substrate 10. The deposited layer of silicon preferably has a thickness generally in the range of 250 Å to 2000 Å. A suitable process for silicon deposition is E-beam evaporation. Following the deposition of silicon layer 110, it is recommended that an in-situ post-deposition vacuum anneal step be performed, preferably at low temperature, for example 225° C., for less than 3 hours. The post-deposition anneal reduces the tendancy of the deposited silicon to absorb oxygen or moisture, which can inhibit the effectiveness of the process. It also reduces the oxygen at the interface 112 between the silicon and silicided regions 90. Lowering the oxygen content of the silicon film 110 has been found to greatly improve the reaction rate of the silicon with the silicon-deficient silicide 90. It also has been found to promote a faster reaction rate between the silicon and silicide regions 90, compared with the reaction rate between silicide 90 and the single-crystal silicon in layer 12.

After the step of depositing a layer of silicon as described with reference to FIG. 7, the next step is to anneal the substrate at a higher temperature than the first RTA of FIG. 5. This step is referred to herein as the second rapid-thermal-anneal (2nd RTA). It is performed in a chamber illustrated schematically at 115 in FIG. 8. The 2nd RTA is performed at a higher temperature than the 1st RTA. The purpose of the 2nd RTA is to react the silicon-deficient silicide phase areas 90 with the overlying deposited silicon film 110, converting the silicon-deficient silicide to disilicide phase silicide.

Figure 8:
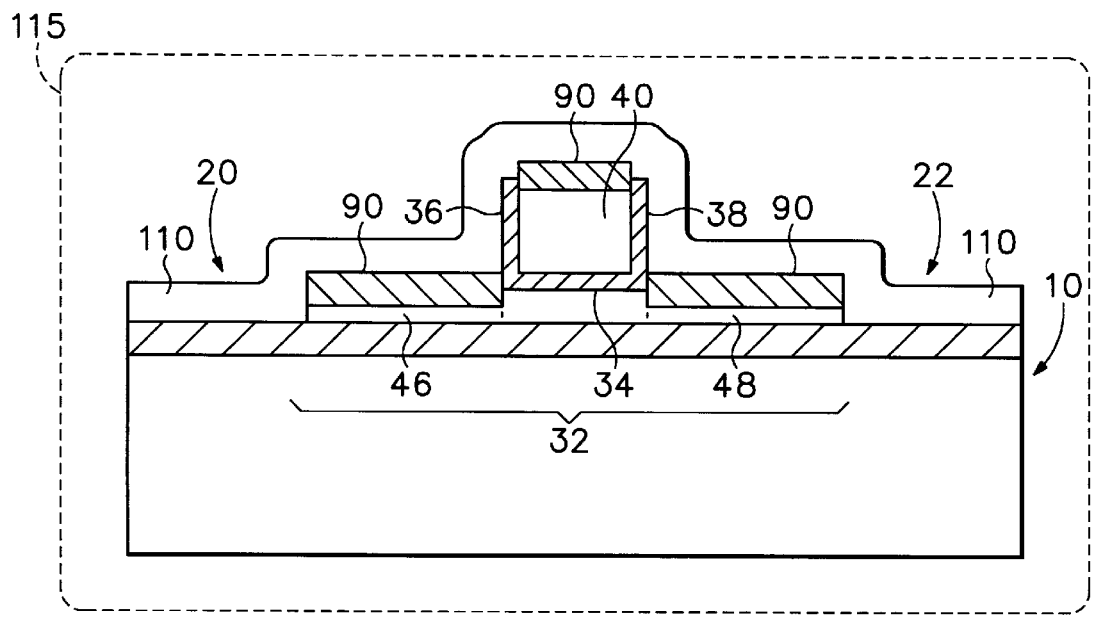

The 2nd RTA of FIG. 8 is performed at a temperature higher than the temperature of the first RTA, preferably above 700° C. The duration of the 2nd RTA is generally in the range of 10 seconds to a maximum of 7 minutes. The preferred temperature range for the 2nd RTA is between 700° C. and 950° C. The silicide layer resulting from the conversion or transformation of silicon-deficient silicide to disilicide phase silicide consumes at least part of the silicon layer 110. It increases the thickness of the silicide layer 110, usually by a factor of 2 or 3 times over the initial thickness of the silicon-deficient silicide regions 90. It has been found that the conversion of silicide-deficient silicide areas 92 to disilicide during the 2nd RTA consumes very little or no additional silicon from the underlying single-crystal silicon of the electrode regions. Most or all of the additional silicon consumed in the conversion to disilicide phase silicide comes from the silicon layer 110. For example, when cobalt silicidation material is used it has been found that a RTA in excess of 700° C. reliably converts the silicon-deficient silicide into cobalt disilicide ($CoSi_2$).

Figure 9:
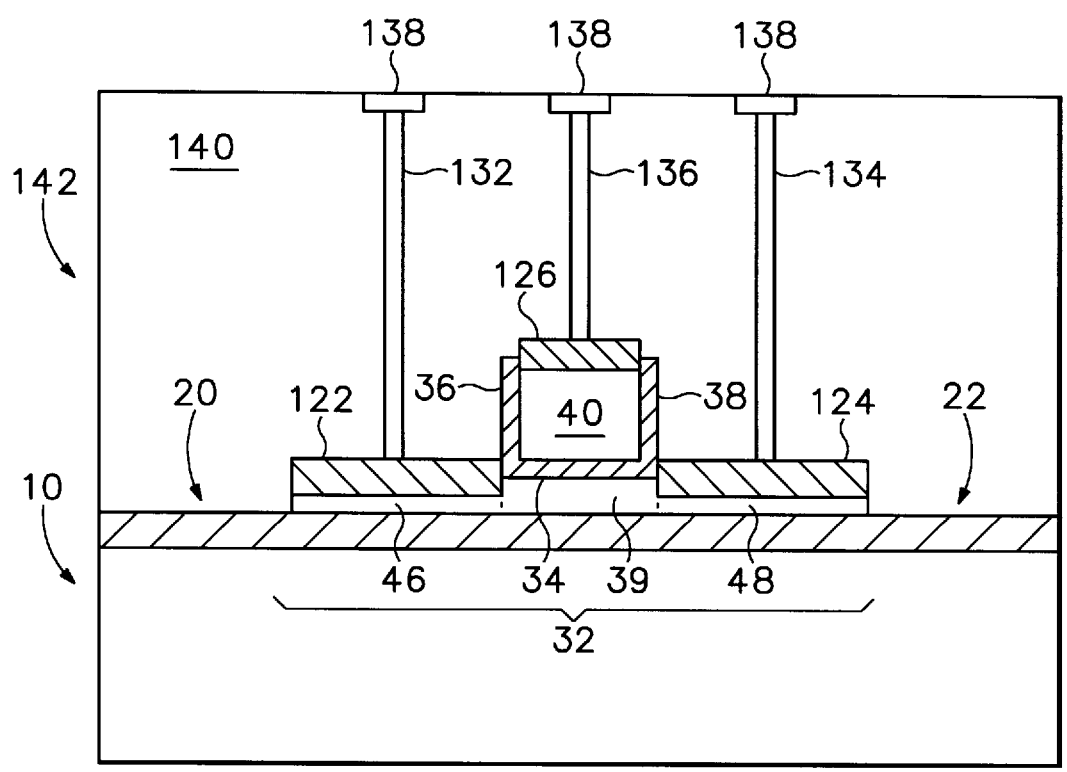
FIG. 9 shows a view, as in FIGS. 1 and 2, of the final connections to the silicided electrodes formed in accordance with the present invention.

Following the 2nd RTA of FIG. 8, the next step is removal of the unreacted Si residue from silicided areas 90 and from the unused or uncombined parts of silicon layer 110 overlying oxide isolation regions 20, 22 and gate sidewalls 36, 38. A plasma etch using, for example, $CF_4/O_2$ plasma is suitable for removing the unreacted deposited silicon. The result of the plasma etch step is shown in FIG. 9. In addition to cleaning silicon from isolation regions 20, 22 and sidewalls 36, 38, silicon is also removed from the surfaces of the metal disilicide contact regions 122, 124, and 126. FIG. 9 also shows representations of external connections to the silicide contact of the device. The device interconnections include metal interconnects 132, 134, 136 which extend to the source and drain silicide contacts 122, 124, and to the gate silicide contact 126, respectively. Interconnects 132, 134, and 136 connect to appropriate connection pads 138 or other suitable interconnection lines (not shown). A suitable body of insulating material 140 surrounds and encloses the completed device 142 formed on substrate 10.

Figure 10:
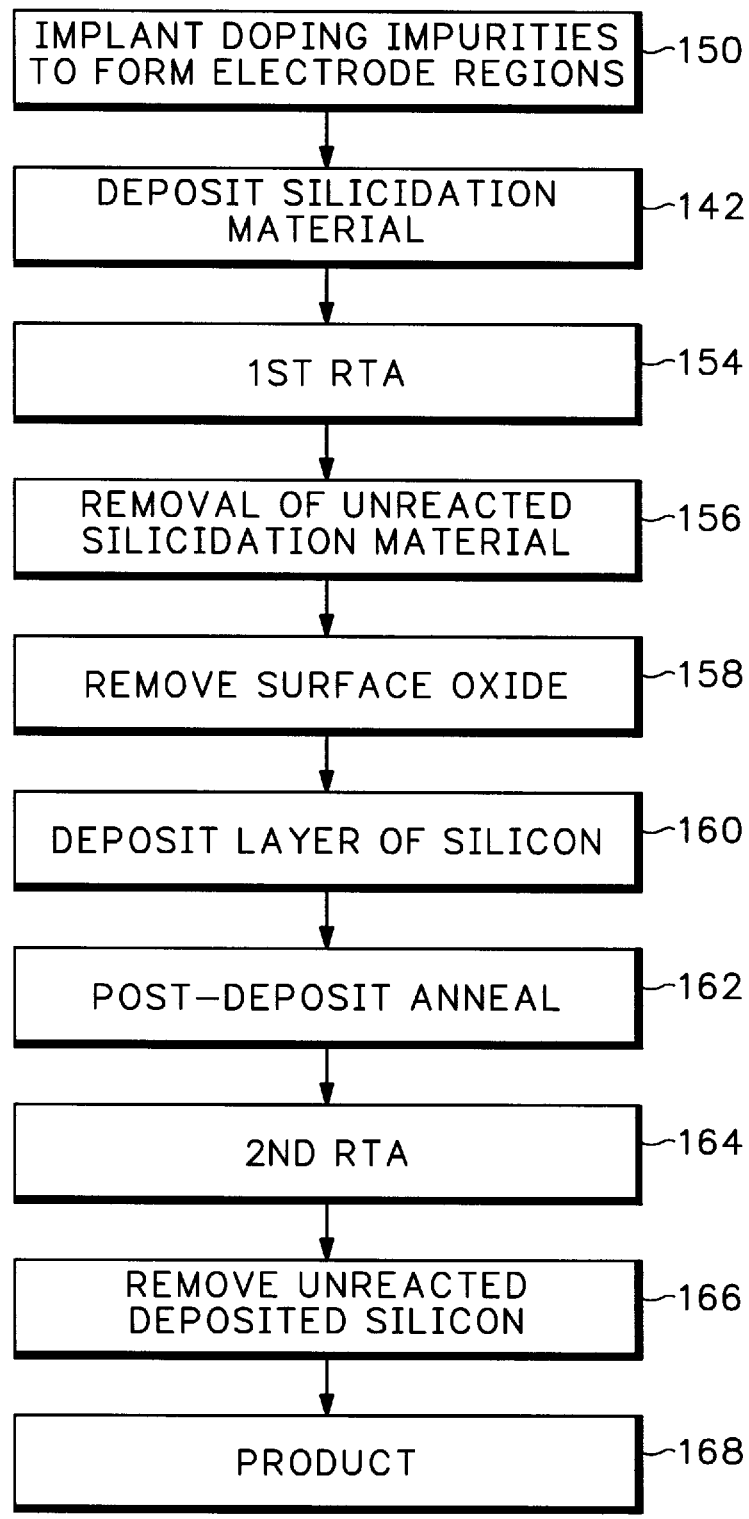
FIG. 10 is a flow chart summarizing the steps in the method of the present invention.

The steps in the method of the present invention are illustrated schematically in FIG. 10. After the substrate is provided, as shown in FIGS. 1–3, the first step 150 is to implant of doping impurities into the active area 32 of the substrate. Typically in wafer processing appropriate doping impurities are directed at the substrate as shown at 42 in FIG. 2. The result of step 150 is the formation of junction regions in electrode the regions 46, 48 of the superficial silicon layer 12. Preferably step 150 produces junction regions extending less than 1000 Å in depth from the surface 16 of the single crystal silicon layer 12. Even shallower junction depths, for example, junction depths of 500 Å or less, are suitable for use with the present invention.

Step 152 is depositing silicidation material on active area 32. As noted above with reference to FIG. 4, the silicidation material is preferably selected from the group consisting of Co, Ti, Ni, and W. The thickness of the silicidation material deposited in step 152 is generally in the range of 50 Å–250 Å.

Step 154 (FIG. 5) is the 1st RTA which is carried out at a temperature of less than 700° C. for between 10 seconds and 5 minutes, and preferably between 10 seconds and 60 seconds. The result of step 154 is a layer of silicon-deficient silicide on the source/drain electrodes which is formed by combining the silicidation material deposited in step 152 with a controlled thickness of the silicon in electrode regions 46, 48.

In the description which follows reference will be made only to the source/drain electrodes formed in electrode regions 46, 48. Discussion of gate electrode 40 is omitted in part because the advantages of the present invention lie in the ability to control source/drain junction depths and to form reliable, thermally stable silicide connections to the shallow source/drain electrodes. The invention does produce similar silicide contacts on the polycrystalline silicon gate electrode 40, although it is less critical to avoid silicon consumption on the gate electrode because of its substantially greater thickness.

The next step 156 is the removal of unreacted or uncombined silicidation material from the non-silicon surfaces on the substrate, as well as from the layer of silicon-deficient silicide created in step 154. Step 156 is carried out using silicidation material etchant, for example, piranha etchant $H_2SO_4/H_2O_2$. Step 158 is the removal surface oxide from the silicon/deficient silicide created in Step 154 using ion beam cleaning or a similar process.

Step 160 is the depositing of a layer of silicon 110 (FIG. 7) on the substrate, including on the silicon-deficient areas 90. The silicon is deposited with a sufficient thickness to provide the silicon for converting the silicon-deficient silicide formed in step 154 to the stable disilicide phase.

Step 162 is a low-temperature anneal (225° C.–250° C.) of the silicon layer 110 to reduce its tendancy to absorb oxygen or moisture and improve its reaction with the silicon-deficient silicide 90. This step is optional but recommended to improve the efficacy of the 2nd RTA.

Step 164 is the 2nd RTA which is performed at a higher temperature than 1st RTA step 154. Preferably the 2nd RTA is performed for between 10 seconds and 5 minutes at a temperature exceeding 700° C. and less than 950° C. The result of the 2nd RTA is the formation of metal disilicide on the source/drain electrode regions 46, 48 in place of the silicon-deficient silicide 90 formed in the step 154.

Finally, step 166 is the removal of unreacted silicon from the silicon layer deposited in step 160 using a suitable silicon etchant, such as $CF_4/O_2$ plasma.

The product 168 is the formation of silicide contact on the source/drain junctions of the transistor. The invention is suitable for forming silicide contacts on electrode junctions which are ultra-thin, for example junctions having a depth of 1000 Å, or even 500 Å or less. The resultant silicide contacts are aligned with the source, drain, and gate electrodes.

Examples of use of the method of the present invention on SIMOX substrates are described below.

EXAMPLE 1

Following the preliminary steps illustrated in FIGS. 1 and 2, or in FIG. 3 if the device is formed in bulk silicon, a layer of cobalt 80 is deposited on the structure of FIG. 4 to a thickness of 90 Å. A 1st RTA is performed (FIG. 5) at 550° C. for 30 seconds. A wet etch using $H_2SO_4/H_2O_2$ is then performed resulting in the formation of $Co_2Si/CoSi$ in metal-deficient silicide regions 90 (FIG. 6). In-situ Ar ion beam cleaning removes oxide from the surfaces of silicon-deficient regions 90. A layer 110 of silicon (FIG. 7) is then deposited over the various structures shown in FIG. 7. The thickness of silicon layer 110 is 160 Å. A 2nd RTA is then performed, as shown in FIG. 8, at 850° C. for 30 seconds. Dicobalt silicide and cobalt silicide in the silicon-deficient regions 90 is transformed into cobalt disilicide ($CoSi_2$). Finally, the unreacted deposited silicon is removed (FIG. 9) from non-silicon (non-silicided) surfaces 20, 22, 36, 38, and from the $CoSi_2$ silicide formed as silicide contacts 122, 124, 126.

In this example the post silicon anneal is omitted, which somewhat inhibited the supply of silicon from layer 110 (FIG. 8) consumed during the second anneal. Nevertheless, suitable cobalt disilicide contacts were formed at 122, 124, 126 (FIG. 9).

EXAMPLE 2

In this example the structure shown in FIG. 4 is initially cleaned using a dilute 50:1 BHF dip for 60 seconds before depositing silicidation material layer 80. The BHF dip removes oxide and other contaminates. A layer of Ti is then deposited on the structure of FIG. 4 to a thickness of 44 Å followed by a layer of Co to a thickness of 150 Å. Thus, in this example, silicidation material layer 80 is made up of two different metal layers, Co and Ti.

The first RTA (FIG. 5) is then performed for 30 seconds at 600° C. Following the first anneal there appears to be an up-diffusion of Ti from the metal-Si interface to the surface of the metal-deficient silicide regions 90. A layer of silicon is then deposited as shown at 110 in FIG. 7. The thickness of deposited silicon is 350 Å. An in-situ post-deposition anneal of silicon layer 110 is performed at 225° C. for two hours. A 2nd RTA is then performed (FIG. 8) at 850° C. for 30 seconds producing $TiSi_2/CoSi_2$ in contact regions 122, 124, 126 of FIG. 9. This example resulted in the complete consumption of the silicon layer 110 in the regions contacting the silicon-deficient silicide areas 90 of FIG. 8.

In this example the consumption of silicon from single-crystal silicon layer 12 was measured to be about 250 Å in thickness. The remaining silicon used in forming silicide contacts 122, 124, 126 came from the 350 Å thickness of the silicon layer 110. The silicide layer formed in this example had an overall thickness of 450 Å on single-crystal silicon source/drain electrodes which are approximately 250 Å thick.

The present invention permits good control of the thickness of single-crystal silicon consumed during the first RTA. That allows for the formation of ultra-thin source/drain junction regions, on the order of 100 Å–200 Å in thickness. The exact processes for controlling the thickness of the source/drain electrodes should be empirically derived before commercial chip fabrication is undertaken. The precise temperature and duration of the anneals, and the desired thickness of electrodes and of the overlying silicide can readily be controlled by adjusting the duration and temperature of the anneals. The process is self-aligning in the same manner as the salicide process because, following the 1st RTA the unreacted metal can be selectively etched leaving the silicon-deficient silicide in place and removing the metal from the isolation regions and the sidewalls.

The present invention reduces the consumption of silicon from the source/drain electrodes by 50%/75% over prior art salicidation processes. The invention requires no additional equipment from that required for conventional salicidation. It allows for the formation of reliable thermally stable silicide contacts on ultra-thin source/drain junction regions, permitting further reductions in device size, speed, and reliability.

Alternative embodiments are possible within the scope of the present invention. Although the process describes silicon-deficient silicide as including generally silicon/metal combinations in which a single silicon atom is combined with one or more silicidation material atoms, other silicon-deficient compounds could be used within the scope of the present invention. In fact, the invention is suitable for use with any silicon compound that ultimately forms silicide in the disilicide phase. The preliminary silicide phase resulting from the 1st RTA could be any suitable compound which converts to a stable disilicide phase upon the incorporation of additional silicon into the compound. As noted above, the description focuses on MOS transistors formed on SIMOX substrates but the process is equally suitable for use forming active devices in bulk silicon. Other variations to the method within the scope of the present invention will occur to those skilled in the art.

What is claimed is:

1. A method of forming a raised silicided source/drain electrode structure for use in a MOS transistor, the electrode structure being formed on a semiconductor substrate having a surface layer of single-crystal silicon, the steps in the method comprising:

a) depositing silicidation material on the single-crystal silicon;

b) rapid-thermal-annealing at a temperature of less than 700° C. to react the silicidation material deposited in step a) with the silicon in the surface layer of the substrate to form a layer of silicon-deficient silicide which is a phase of silicide having proportionately less silicon and more silicidation material than disilicide phase silicide;

c) removing material other than silicon-deficient silicide from the silicon-deficient silicide layer formed in step b) including removing unreacted silicidation material;

d) depositing a layer of silicon on the silicon-deficient silicide layer;

e) rapid-thermal-annealing at a higher temperature than step b) to react the silicon-deficient silicide layer formed in step b) predominately with silicon from the layer of deposited silicon deposited in step d), whereby the silicon-deficient silicide is transformed into predominately metal-disilicide; and f) removing the unreacted silicon from the metal-disilicide to provide a raised silicided electrode.

2. A method as in claim 1 in which step a) includes depositing silicidation material to a thickness of 50 Å–250 Å on the single-crystal silicon.

3. A method as in claim 1 in which step a) includes depositing silicidation material from the group consisting of Co, Ti, Ni, W, Pt, Pd, Mo, and Ta.

4. A method as in claim 1 in which the first rapid-thermal-annealing of step b) includes annealing at a temperature of between 400° C. and 650° C. for between 10 seconds and 60 seconds.

5. A method as in claim 1 in which the second rapid-thermal-annealing of step e) includes annealing at a temperature of between 700° C. and 950° C. for between 10 seconds and 5 minutes.

6. A method as in claim 1 in which step f) includes etching the silicon layer using $CF_4/O_2$ plasma to remove the unreacted silicon from the metal-disilicide.

7. A method as in claim 1 in which step c) includes etching with a silicidation material etchant to remove unreacted silicidation material from the silicon-deficient silicide.

8. A method as in claim 7 in which the silicidation material etchant is selected from the group consisting of $H_2SO_4/H_2O_2$ and $NH_4OH/H_2$.

9. A method as in claim 8 in which step c), following the step of etching with silicidation material etchant, further includes ion beam cleaning to remove surface oxide formed during the etching step.

10. A method of forming silicided electrodes on an active area of a semiconductor substrate where devices are formed, the active area including a layer of single-crystal silicon adjacent the surface of the substrate, a gate structure on the single-crystal silicon, and electrode areas on the single-crystal silicon on opposite sides of the gate structure, the gate structure including a gate electrode, gate insulation, and insulating sidewalls, the steps in the method comprising:

a) implanting doping impurities into the active area to form junction regions in the electrode regions of the active area, the electrode regions being regions of surface silicon where device electrodes are formed;

b) depositing a layer of silicidation material on the active area;

c) rapid-thermal-annealing at a temperature of less than 700° C. to react silicidation material deposited in step b) with silicon in the electrode regions of the active area to form silicon-deficient silicide on the electrode regions, silicon-deficient silicide being a phase of silicide having proportionately less silicon and more silicidation material than disilicide phase silicide, whereby the electrode regions of the active area are covered with silicon-deficient silicide and the nonelectrode regions of the active area, outside the electrode regions, are covered with unreacted silicidation material;

d) selectively etching the silicidation material to remove unreacted silicidation material from the nonelectrode regions of the active area and from the silicon-deficient silicide on the electrode regions of the active area;

e) cleaning the silicon-deficient silicide on the electrode regions to remove surface oxide therefrom;

f) depositing a layer of silicon;

g) annealing at a higher temperature than step c) to react the silicon-deficient silicide on the electrode regions predominately with silicon in the layer of silicon deposited in step f) to transform the silicon-deficient silicide to the disilicide phase, whereby disilicide phase silicide is formed on the electrode regions; and h) removing unreacted deposited silicon remaining after annealing step g), whereby raised silicided electrodes are formed in the electrode regions.

11. A method as in claim 10 in which step b) includes depositing one or more layers of silicidation material selected from the group consisting of refractory metals and noble metals to a thickness of 50 Å–500 Å on the active area.

12. A method as in claim 10 in which the first rapid-thermal-annealing of step c) includes annealing at a temperature of between 400° C. and 650° C. for between 10 seconds and 60 seconds.

13. A method as in claim 10 in which the second rapid-thermal-annealing of step g) includes annealing at a temperature of between 700° C. and 950° C. for between 10 seconds and 5 minutes.

14. A method as in claim 10 in which selective etching step d) includes etching the active area with etchant selected from the group consisting of $H_2SO_4/H_2O_2$ and $NH_4OH/H_2O_2$ to remove unreacted silicidation material from the nonelectrode regions and from the silicon-deficient silicide on the electrode regions, and cleaning step e) includes ion beam cleaning to remove residual oxide from the surface of the silicon-deficient silicide.

15. A method as in claim 14 in which the ion beam cleaning is an Argon ion beam cleaning.

16. A method as in claim 10 in which step f) includes depositing a layer of silicon over the active area having a thickness generally in the range of 250 Å to 2000 Å.

17. A method as in claim 10 in which step h) includes etching using $CF_4/O_2$ plasma to remove unreacted silicon.

18. A method as in claim 10 in which the doping impurities implanted into the active area in step a) are implanted to a depth which forms junction regions extending less than 1000 Å below the surface of the substrate.

19. A method as in claim 10 in which the layer of silicidation material deposited in step b) has a total thickness of less than half the thickness of the junction regions formed in the active area of the substrate in step a) and the silicon in the electrode regions consumed during the formation of silicon-deficient silicide during step c) leaves at least 100 Å of the silicon in the junction regions unreacted with silicidation material.

20. A method of forming a MOS transistor with silicided source and drain electrodes in a selected area of a semiconductor substrate which includes a surface layer of single-crystal silicon and includes a gate structure centrally disposed on the selected area of the substrate, the gate structure including a gate electrode, gate insulation, and insulating sidewalls, the method comprising the following steps:

a) implanting doping impurities into the selected area and forming source and drain junction regions extending less than 1000 Å in depth from the surface of the single-crystal silicon, whereby source and drain junction regions are created on opposite sides of the gate structure;

b) depositing silicidation material selected from the group consisting of refractory metals and noble metals on the selected area;

c) rapid-thermal-annealing for between 10 seconds and 60 seconds at a temperature of less than 700° C. to combine the silicidation material which is deposited on the silicon in the selected area with a surface portion of the silicon in the selected area, said surface portion being less than the full thickness of the source and drain junction regions formed in step a), and leaving at least 100 Å of thickness of the junction regions in the selected area uncombined with silicidation material to produce a layer of silicon-deficient silicide overlying the source and drain junction regions, such silicon-deficient silicide being a phase of silicide having proportionately less silicon and more silicidation material than disilicide phase silicide;

d) etching with a silicidation material etchant to remove from the selected area silicidation material which remains uncombined with silicon from the source and drain junction regions in preceding step c), whereby silicidation material is removed from all non-silicon surfaces and residual silicidation material is removed from the layer of silicon-deficient silicide created in step d);

e) ion beam cleaning to remove surface oxide formed in the preceding steps;

f) depositing a layer of silicon on the selected area;

g) annealing at a higher temperature than step c) to react the silicon-deficient silicide predominately with the layer of silicon deposited in step f), whereby the silicon-deficient silicide is transformed into metal disilicide which is predominately disilicide phase silicide;

h) etching with a silicon etchant to remove unreacted silicon from the areas of metal disilicide, whereby the metal disilicide areas form silicided electrodes.

* * * * *